(12) United States Patent
Steinbach et al.

(10) Patent No.: US 7,424,382 B2
(45) Date of Patent: Sep. 9, 2008

(54) CHARACTERIZING EYE DIAGRAMS

(75) Inventors: Gunter Steinbach, Palo Alto, CA (US);
Brian J. Galloway, Campbell, CA (US);
Ken A. Nishimura, Fremont, CA (US)

(73) Assignee: Agilent Technologies, Inc., Santa Clara, CA (US)

( * ) Notice: Subject to any disclaimer, the term of this patent is extended or adjusted under 35 U.S.C. 154(b) by 288 days.

(21) Appl. No.: 10/996,579

(22) Filed: Nov. 23, 2004

(65) Prior Publication Data
US 2006/0109896 A1 May 25, 2006

(51) Int. Cl.
*H04B 17/00* (2006.01)
(52) U.S. Cl. .................................... 702/108
(58) Field of Classification Search ............... 702/108, 702/85, 127
See application file for complete search history.

(56) References Cited

U.S. PATENT DOCUMENTS

| | | | |
|---|---|---|---|
| 4,707,840 A | 11/1987 | Nakayama | |
| 5,309,157 A | 5/1994 | Yee | |
| 5,319,372 A | 6/1994 | Yee | |
| 5,323,423 A | 6/1994 | Townsend et al. | |
| 5,333,147 A * | 7/1994 | Nohara et al. ............... | 375/224 |
| 5,392,045 A | 2/1995 | Yee | |
| 6,546,063 B1 | 4/2003 | Lee et al. | |
| 6,768,703 B2 | 7/2004 | Nygaar, Jr. et al. | |
| 6,784,653 B2 | 8/2004 | Baumert | |
| 2002/0060820 A1 | 5/2002 | Buchali | |
| 2002/0133730 A1 | 9/2002 | Zabinski et al. | |
| 2003/0043900 A1 | 3/2003 | Deas et al. | |
| 2003/0048859 A1 | 3/2003 | Wedding | |
| 2004/0066867 A1 | 4/2004 | Fujimori et al. | |
| 2005/0058234 A1* | 3/2005 | Stojanovic ................. | 375/371 |

FOREIGN PATENT DOCUMENTS

EP   1292078 A1   12/2003

OTHER PUBLICATIONS

Ellermeyer et al., "A 10 Gb/s Eye-Opening Monitor IC for Decision-Guided Adaptation of the Frequency Response of an Optical Receiver," IEEE Journal of Solid-State Circuits, vol. 35, No. 12 (Dec. 2000), p. 1958-1963.
"Eye Measurements on Optical RZ Signals," Tektronix, Technical Brief, www.tektronix.com/optical (2002), p. 1-12.
Corrected International Search Report dated Aug. 22, 2006 from corresponding PCT patent aplication No. PCT/US05/38594.
Holzlohner, Ronald, Accurate calculation of eye diagram and bit error rates in optical transmission system using linearization, Mar. 2002, pp. 389-400.

* cited by examiner

*Primary Examiner*—Tung S Lau

(57) ABSTRACT

Systems and methods of characterizing eye diagrams are described. In one aspect, at measurement times across a measurement interval spanning at least one unit interval of the input signal, corresponding levels of the input signal are classified into groups based on at least one threshold. An eye diagram characteristic width is derived based on a distribution across the measurement interval of the levels in one of the groups.

28 Claims, 7 Drawing Sheets

CHARACTERIZING EYE DIAGRAMS

BACKGROUND

An eye diagram corresponds to a superposition of samples of a serial data signal over a unit interval of the data signal (i.e., the shortest time period over which the data signal can change state). An eye diagram may be generated by applying the serial data signal to the vertical input of an oscilloscope and triggering a horizontal sweep across the unit interval based on the data rate of the serial data signal. When the serial data signal corresponds to a pseudorandom data signal, the superposed samples appear on the oscilloscope display as an eye diagram with an eye opening bounded by two transition regions. Various features of the eye opening reveal information about the quality of the communications channel over which the serial data signal is transmitted. For example, a wide eye opening indicates that the serial data signal has a relatively low noise level and a relatively low bit error rate, whereas a narrow eye opening indicates that the serial data signal has a relatively high noise level and a relatively high bit error rate.

An eye diagram typically is evaluated based on the width of the eye opening, the height of the eye opening, and the rate of closure of the eye opening with variation of the sampling time. The width of the eye opening corresponds to the time interval over which the serial data signal can be sampled without inter-symbol interference. The height of the eye opening corresponds to a measure of the signal-to-noise ratio of the serial data signal. The rate of closure of the eye opening with variation of the sampling time indicates the sensitivity of the serial data signal to timing errors.

Various eye monitor circuits have been developed that measure one or more characteristic features of an eye diagram of a serial data signal in real-time. The measured features typically are used to correct distortions that are introduced into the serial data signal by the communication channel. For example, the frequency responses of some adaptive equalizers are optimized based on measurements of current signal quality as indicated by one or more characteristic eye diagram features.

The cost and power dissipation requirements of eye monitor circuits are dominated by the number of high-speed hardware components in the eye monitor circuit. Consequently, eye monitor circuits that have fewer high-speed hardware components provide a strategic advantage over other eye monitor circuits that have more high-speed hardware components.

SUMMARY

In one aspect, the invention features a method of characterizing an eye diagram of an input signal. In accordance with this inventive method, at measurement times across a measurement interval spanning at least one unit interval of the input signal, corresponding levels of the input signal are classified into groups based on at least one threshold. An eye diagram characteristic width is derived based on a distribution across the measurement interval of the levels in one of the groups.

In another aspect, the invention features a system for characterizing an eye diagram of an input signal that includes a classification circuit and a post-processing circuit. The classification circuit is operable to classify, at measurement times across a measurement interval spanning at least one unit interval of the input signal, corresponding levels of the input signal into groups based on at least one threshold. The post-processing circuit is coupled to the classification circuit and is operable to derive an eye diagram characteristic width based on a distribution of the levels in at least one of the groups across the measurement interval.

Other features and advantages of the invention will become apparent from the following description, including the drawings and the claims.

DETAILED DESCRIPTION

In the following description, like reference numbers are used to identify like elements. Furthermore, the drawings are intended to illustrate major features of exemplary embodiments in a diagrammatic manner. The drawings are not intended to depict every feature of actual embodiments nor relative dimensions of the depicted elements, and are not drawn to scale.

I. System Architecture Overview

The embodiments described in detail below robustly and efficiently characterize an eye diagram of an input signal in real-time. These embodiments may be implemented using primarily low-cost components that have relatively low power dissipation requirements. Consequently, these embodiments provide a strategic advantage in many application environments, such as serial-link receivers with adaptive equalizers, where cost and power considerations are significant factors.

Figure 1:
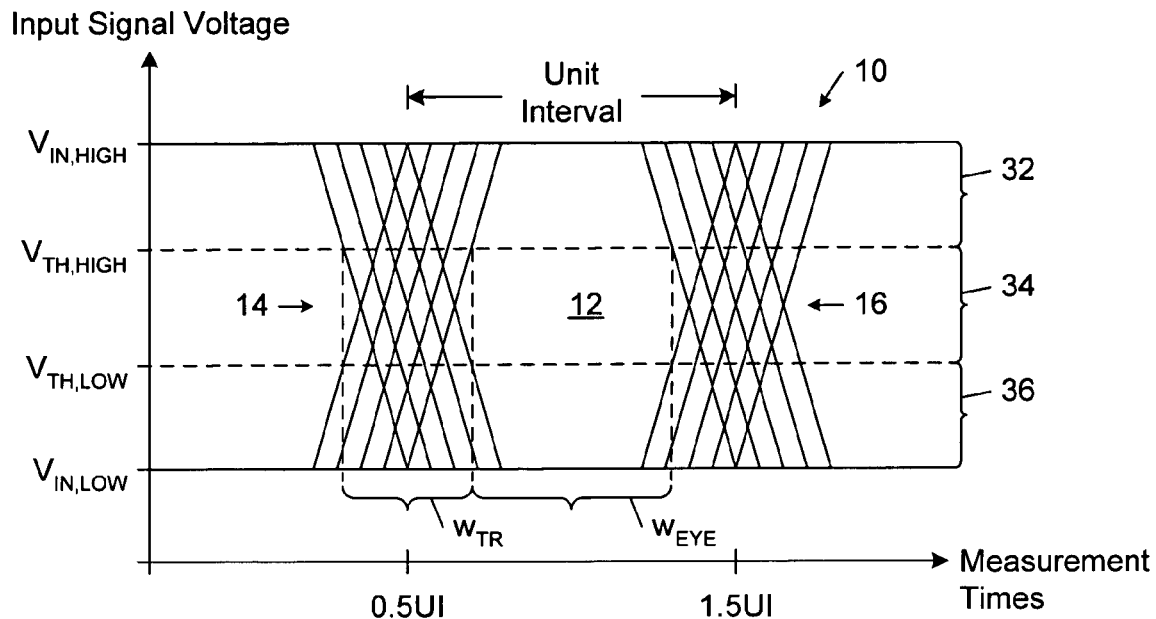
FIG. 1 is a schematic representation of an eye diagram of an input signal in which the vertical axis is divided into a high signal band, a center signal band, and a low signal band by a high threshold and a low threshold.

FIG. 1 shows a schematic representation of an eye diagram 10 of an input signal. The eye diagram 10 may be generated by applying the serial data signal to the vertical input of an oscilloscope and triggering a horizontal sweep across the unit interval based on the data rate of the serial data signal. The input signal is sampled based on a sample clock signal that typically is synchronized to the input signal. Each sample time corresponds to a different respective phase shift relative to the sample clock. When the serial data signal corresponds to a pseudorandom data signal, the superposed samples appear on the oscilloscope display as the eye diagram shown diagrammatically in FIG. 1. The unit interval is the shortest time period over which the input signal can change state. The unit interval is equal to the reciprocal of the maximum bit rate of the input signal.

The eye diagram 10 contains a central eye region 12 that is located between two transition regions 14, 16. The eye diagram 10 has an eye opening characteristic width ($w_{EYE}$) that measures the interval between the adjacent transition regions 14, 16 and a transition region characteristic width ($w_{TR}$) that measures the spread in signal transitions. The sum of the eye opening width and the transition region characteristic width equals one unit interval (UI). That is, $$1\ UI = w_{EYE} + w_{TR} \quad (1)$$

Figure 2:
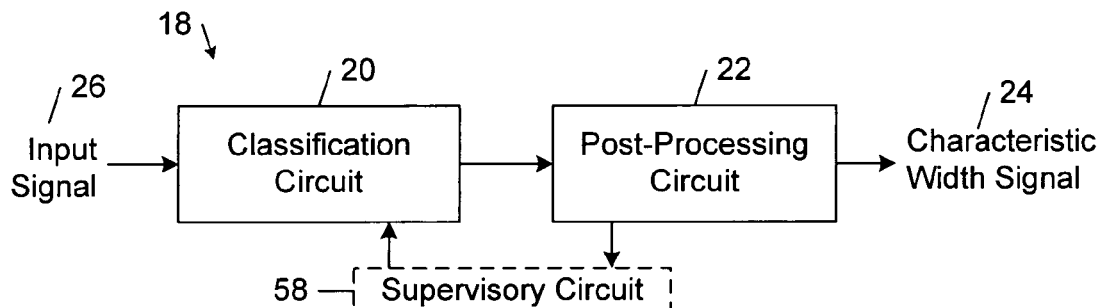
FIG. 2 is a block diagram of an embodiment of a system for characterizing an eye diagram that includes a classification circuit, a post-processing circuit, and an optional supervisory circuit.

FIG. 2 shows an eye diagram characterization system 18 that includes a classification circuit 20 and a post-processing circuit 22. As explained in detail below, at different measurement times across a measurement period, the classification circuit 20 classifies the corresponding levels of the input signal into groups and, based on the distribution across the measurement interval of the input signals levels in one of the groups, the post-processing circuit 22 generates a characteristic width signal 24 that provides a measure of a characteristic width of the eye diagram 10.

Figure 3:
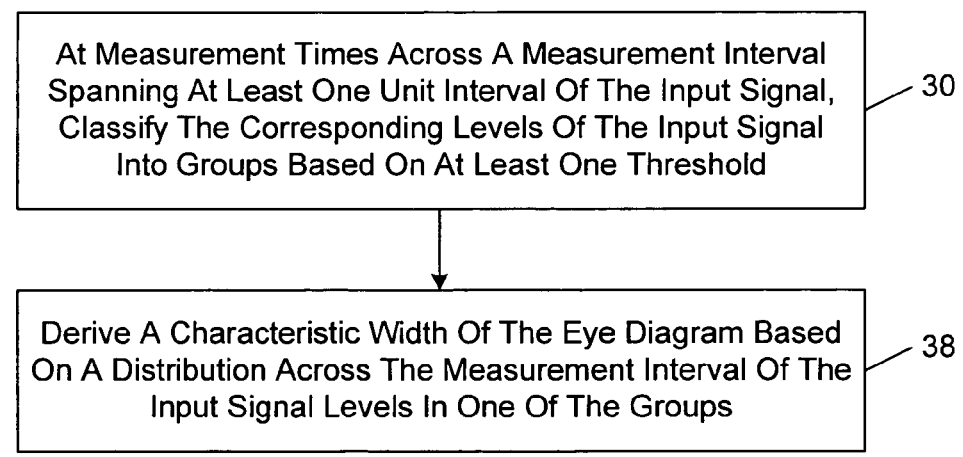
FIG. 3 is a flow diagram of an embodiment of a method of characterizing an eye diagram.

FIG. 3 shows an embodiment of a method by which the eye diagram characterization system 18 generates the characteristic width signal 24 from an input signal 26. The input signal 26 may be a data signal that is received directly from a communications channel or it may be a processed data signal (e.g., an equalized data signal received from an adaptive equalizer). The input signal 26 may be encoded in accordance with a non-return-to-zero line format.

At measurement times across a measurement interval that spans at least one unit interval of the input signal 26, the classification circuit 20 classifies the corresponding levels of the input signal into groups based on at least one threshold (block 30). The measurement times are set based on a clock signal that typically is synchronized to the input signal 26, and each measurement time corresponds to a different respective phase shift relative to the trigger clock. In one embodiment, the classification circuit 20 classifies the input signal levels based on a first threshold and a second threshold. In the illustrated embodiments, the classification circuit 20 classifies input signal levels based on a high threshold ($V_{TH,HIGH}$) and a low threshold ($V_{TH,LOW}$) which are located between the high and low levels ($V_{IN,HIGH}$, $V_{IN,LOW}$) of the input signal 26. The high threshold and the low threshold divide the input signal voltage axis of the eye diagram 10 into three bands: a high signal band 32, a center signal band 34, and a low signal band 36. The central eye region 12 contains the non-center input signal levels that are outside the center signal band 34 (i.e., within the high signal band 32 or the low signal band 36) and the transition regions 12, 14 contain the center input signal levels that are within the center signal band 34.

The post-processing circuit 22 derives a characteristic width of the eye diagram 10 based on a distribution of the input signal levels in one of the groups across the measurement interval (block 38). In some embodiments, the post-processing circuit 22 infers a characteristic width of the eye diagram from the distribution of center input signal levels across the measurement interval. In other embodiments, the post-processing circuit 22 infers a characteristic width of the eye diagram from or from the distribution of non-center input signal levels across the measurement interval. After one of the characteristic widths of the eye diagram 10 has been determined, the other characteristic width can be calculated using equation (1).

II. Implementations of the Classification Circuit

As explained above, in the illustrated embodiments, the classification circuit 20 classifies the input signal levels into groups based on the high threshold ($V_{TH,HIGH}$) and the low threshold ($V_{TH,LOW}$).

Figure 4:
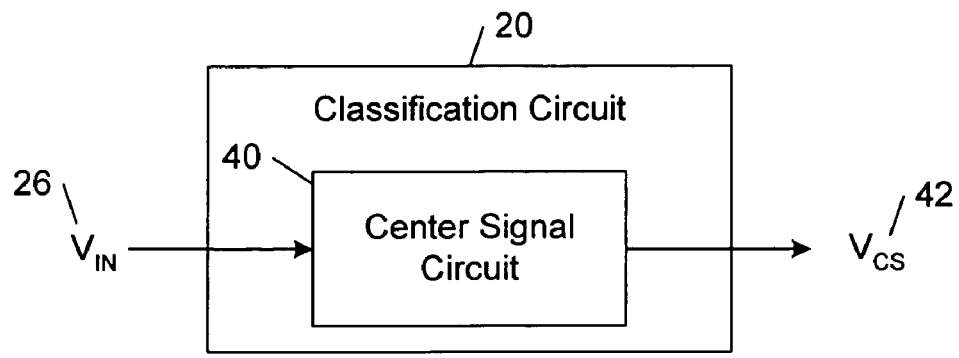
FIG. 4 is a block diagram of an implementation of the classification circuit shown in FIG. 2 that includes a center signal circuit.

Referring to FIG. 4, in some implementations, the classification circuit 20 includes a center signal circuit 40 that generates a center signal 42 ($V_{CS}$) from the input signal 26 ($V_{IN}$). The center signal 42 is indicative of the distributions of center input signal levels and non-center input signal levels across the measurement interval.

Figure 5:
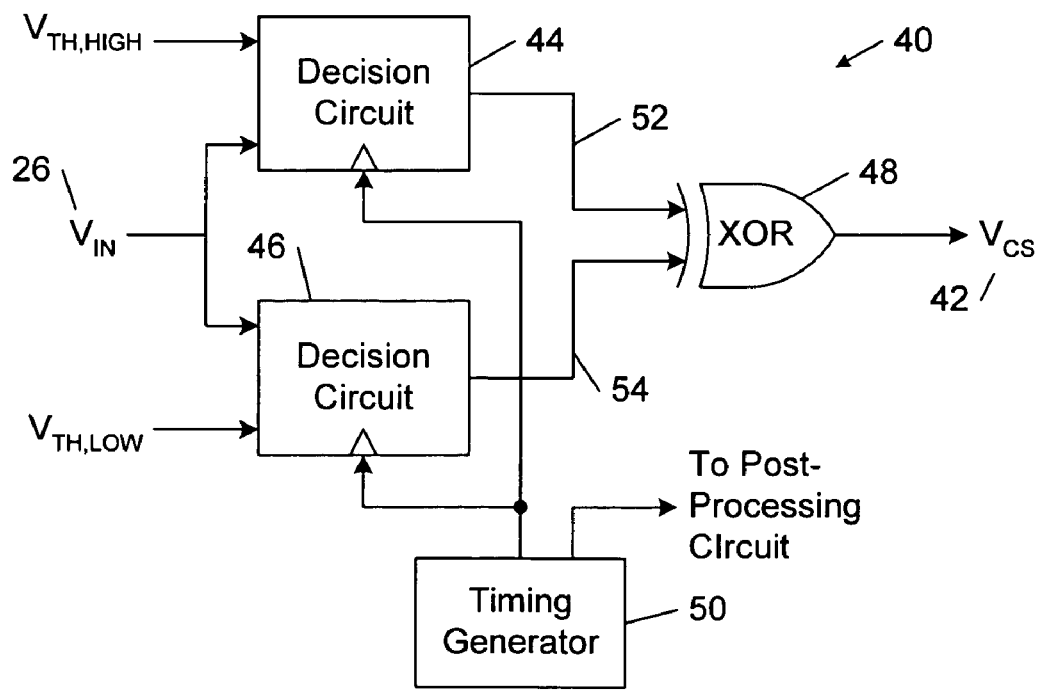
FIG. 5 is a block diagram of an implementation of the center signal circuit shown in FIG. 4 that includes two decision circuits and an XOR logic gate.

FIG. 5 shows an implementation of the center signal circuit 40 that includes first and second decision circuits 44, 46 and an XOR logic gate 48. The first and second decision circuits 44, 46 slice the input signal 26 at measurement times that are set by a measurement clock signal generated by a timing generator 50. The decision circuits 44, 46 use decision thresholds that are set by the high threshold ($V_{TH,HIGH}$) and the low threshold ($V_{TH,LOW}$), respectively. The first decision circuit 44 generates a first comparison signal 52 based on comparisons of the levels of the input signal 26 at the corresponding measurement times to the high threshold ($V_{TH,HIGH}$). The first comparison signal 52 is true when the input signal levels are above the high threshold ($V_{TH,HIGH}$). The second decision circuit 46 generates a second comparison signal 54 based on comparisons of the levels of the input signal 26 at the corresponding measurement times to the low threshold ($V_{TH,LOW}$). The second comparison signal 54 is true when the input signal levels are above the low threshold ($V_{TH,LOW}$). The XOR logic gate 48 generates the center signal 42 by combining the first and second comparison signals 52, 54 in accordance with the XOR logical operation. As a result, the center signal 42 is true for each of the input signal levels that is within the center signal band 34 and is false for each of the input signal levels that is outside of the center signal band 34.

Figure 6A:
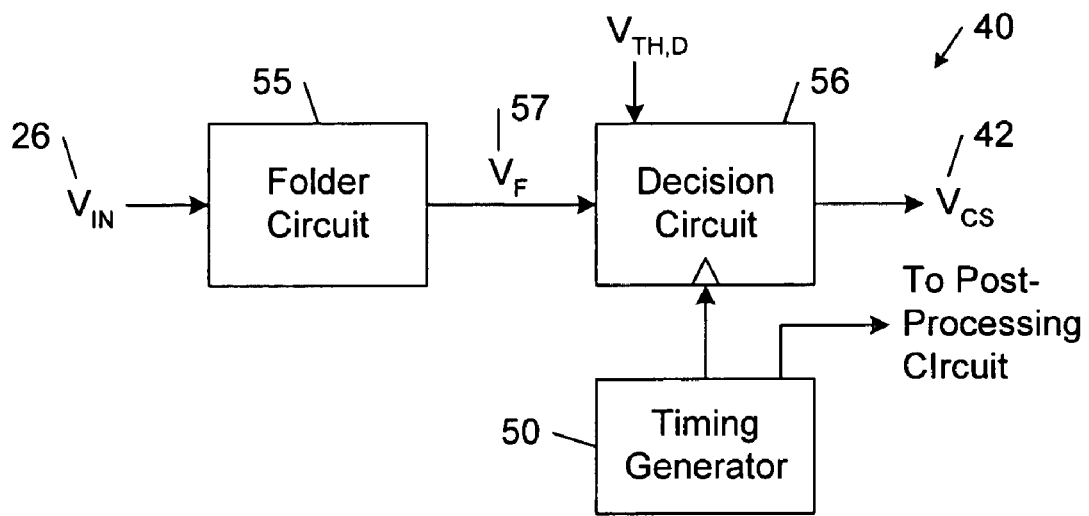
FIG. 6A is a block diagram of an implementation of the center signal circuit shown in FIG. 4 that includes a folder circuit and a decision circuit.
Figure 6B:
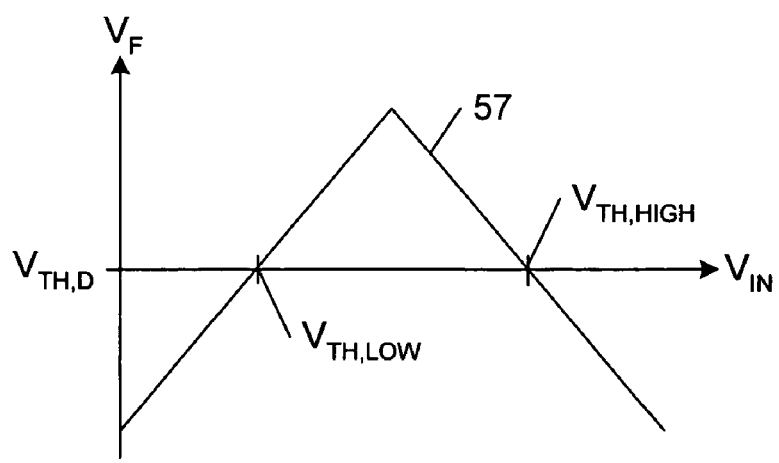
FIG. 6B is a graph of an output signal of the folder circuit shown in FIG. 6A plotted as a function of an input signal of the folder circuit.

Referring to FIGS. 6A and 6B, in another implementation, the center signal circuit 40 includes a folder circuit 55 and a decision circuit 56. As shown in FIG. 6B, in a known implementation, the folder circuit 55 generates from the input signal 26 a folded signal 57 ($V_F$) that has a level on a first side of a decision threshold )$V_{TH,D}$) for each of the center input signal levels and a level on a second side of the decision threshold ($V_{TH,D}$) opposite the first side for each of the non-center input signal levels. At measurement times that are set by the timing generator 50, the decision circuit 56 thresholds the folded signal 57 at the decision threshold ($V_{TH,D}$). The resulting center signal 42 is true for each of the input signal levels that is within the center signal band 34 and is false for each of the input signal levels that is outside of the center signal band 34.

In the above-described implementations of the center signal circuit 40, the decision circuits 44, 46, 56 may be implemented using comparators that compare the input signal levels to the high and low thresholds and flip-flops that latch the comparison results to the measurement clock that is generated by the timing generator 50.

III. The Supervisory Circuit

Referring back to FIG. 2, in some implementations, the eye diagram characterization system 18 additionally includes a supervisory circuit 58 that is configured to adjust at least one of the high and low thresholds ($V_{TH,HIGH}$, $V_{TH,LOW}$) that are used by the decision circuits 44, 46 and the folder circuit 52 to define the center signal band 34.

In some implementations, the supervisory circuit 58 is operable to narrow separation between the high and low thresholds in response to a determination that the populations of the input signal levels within one or more of the high, center and low signal bands 34, 36, 38 are below a threshold population level. These implementations allow the eye diagram characterization system 18 to handle eye diagrams with eye openings that are so small that the transition regions 14, 16 are not distinguishable from the center region 12. The supervisory circuit 58 narrows the center signal band 34 until the transition regions 14, 16 are distinguishable by the decision circuits 44, 46 and the folder circuit 52.

In some implementations, the supervisory circuit 58 is operable to widen separation between the first and second thresholds in response to a determination that a derived transition region characteristic width ($w_{TR}$) of the eye diagram 10 is narrower than a threshold width. This allows the supervisory circuit 58 to increase the resolution of the characteristic width measurement for eye diagrams 10 that have very narrow transition regions 14, 16.

IV. Implementations of the Post-Processing Circuit

As explained above, the post-processing circuit 22 derives a characteristic width of the eye diagram 10 based on a distribution across the measurement interval of the input signal levels in at least one of the groups. In the embodiments described in detail below, the post-processing circuit 22 infers a characteristic width of the eye diagram from the distribution of center input signal levels across the measurement interval, as indicated by the center signal 42. In other embodiments, the post-processing circuit 22 infers a characteristic width of the eye diagram from the distribution of non-center input signal levels across the measurement interval.

Figure 7:
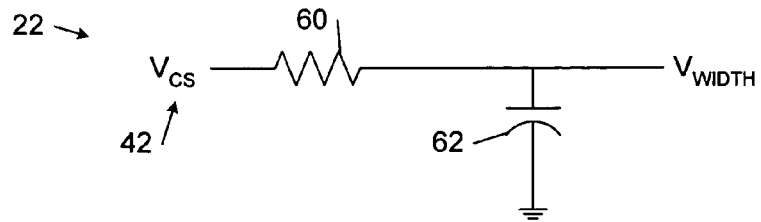
FIG. 7 is a circuit diagram of an implementation of the post-processing circuit shown in FIG. 2.

FIG. 7 shows a low-pass filter implementation of the post-processing circuit 22 that includes a resistor 60 and a capacitor 62. The resistor 60 has a resistance R and the capacitor 62 has a capacitance C. In some embodiments, the parameters R and C are selected so that the time constant ($\tau$) of the low-pass filter is much longer than the period ($T_{MEASUREMENT}$) between measurement times. That is, $$\tau = R \times C \ll T_{MEASUREMENT} \quad (2)$$

As a result, the voltage ($V_{WIDTH}$) output from the low-pass filter, scaled to the voltage swing of the center signal 42, is an indication of the ratio $R_S$ of the population of samples that fell within the center signal band 34 to the population of samples that fell outside of the center signal band 34. In particular, the population ratio $R_S$ is given by:

$$R_S = D_T \times W_T \times V_{CSB} \quad (3)$$

The parameter $D_T$ is the transition density, $W_T$ is the width of the transition region as a fraction of the unit interval (i.e., $W_T = w_{TR}/UI$), and $V_{CSB}$ is the height of the center signal band 34 between the high and low decision thresholds given by:

$$V_{CSB} = V_{TH,HIGH} - V_{TH,LOW} \quad (4)$$

In some embodiments, $V_{TH,HIGH}$ and $V_{TH,LOW}$ are fixed and, therefore, $V_{CSB}$ is a constant. Additionally, in many practical serial communications systems, the transition density $D_T$ is essentially constant over time scales ($\tau$) achievable with practical low-pass filters. Accordingly, in many cases, the scaled voltage output ($V_{WIDTH}$) of the low-pass filter provides a first-order approximation of the characteristic width ($w_{TR}$) of the transition region 14 as a fraction of the unit interval. Thus, in may applications in which the transition region characteristic width ($w_{TR}$) is to be minimized (or the eye opening width is to be maximized), the scaled voltage output ($V_{WIDTH}$) may be used as a proxy for a measure of the actual transition region characteristic width.

Figure 8A:
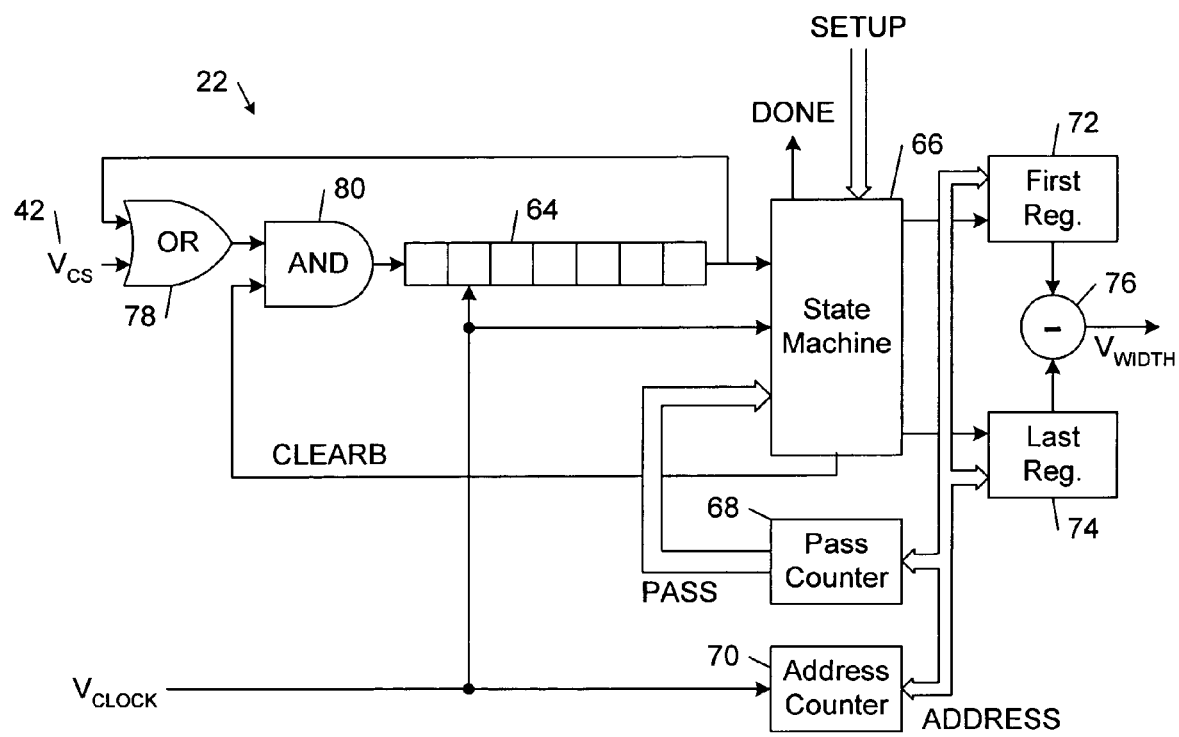
FIG. 8A is a block diagram of an implementation of the post-processing circuit shown in FIG. 2.

FIG. 8A shows an implementation of the post-processing circuit 22 that provides a more direct measurement of the characteristic width ($w_{TR}$) of the transition region 14. This implementation includes a shift register 64, a state machine 66, a pass counter 68, an address counter 70, a first register 72, a last register 74, a digital subtractor 76, and OR and AND logic gates 78, 80 in a feedback loop with the shift register 64. In operation, the shift register 64 is clocked by the measurement clock ($V_{CLOCK}$) generated by the same timing generator 50 that is used to clock the decision circuits in the classification circuit 20. The center signal 42 that is output from the classification circuit 20 and the serial output from the shift register 64 are combined in the OR logic gate 78 such that existing true values are recirculated and new true values are added as they arrive on repeated measurements over the eye diagram 10. The pass counter 68 is incremented after each pass over the measurement interval.

After many passes over the measurement interval, the regions of the shift register 64 that have true values represent the regions of the eye diagram that have samples with values in the center signal band 34 (i.e., center input signal levels). The width of the transition region 14 corresponds to the difference between the first and last addresses of the shift register 64 that have true values. To generate the transition region characteristic width output ($V_{WIDTH}$), the state machine 66 resets the first and last registers 72, 74 every time the address counter rolls over at the start of every new pass over the measurement interval. After the reset, the state machine 66 clocks the address of the first true value received from the shift register 64 into the first register 72. Every time the state machine 66 receives a true value from the shift register 64, the state machine 66 clocks the address of the true value into the last register 74. At the end of every pass over the measurement interval, the first and last registers 72, 74 hold the addresses of the first and last true values, which correspond to the earliest and latest times of input signal levels in the center signal band 34, respectively. The digital subtractor 76 outputs a signal ($V_{WIDTH}$) that corresponds to the difference between the two addresses and is indicative of the width of the transition region 14.

The state machine 66 determines the number of passes over the measurement interval based on the PASS signal that is output by the pass counter 68. After a preset number of passes over the measurement interval, the state machine 66 sets the DONE signal to true, flagging the completion of a measurement. The state machine 66 also sets the CLEARB signal to false for the duration of at least one whole pass over the measurement interval. This causes the AND logic gate 80 to generate false values, which are shifted into the shift register 64, thereby clearing the contents of the shift register 64 for a subsequent measurement.

Figure 8B:
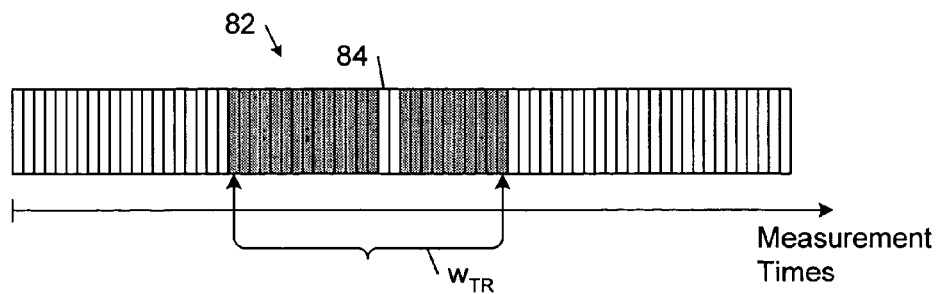
FIG. 8B is a diagrammatic view of the contents of a shift register in the post-processing circuit of FIG. 8A.

The implementation of the post-processing circuit 22 shown in FIG. 8A is insensitive to holes in the transition region (i.e., regions with no transitions or with very low probability of finding transitions). FIG. 8B shows an example of a transition record 82 that has a hole 84 and corresponds to an eye diagram 10 that has a distinct double trace, as opposed to a broad region filled with transitions. The implementation of the post-processing circuit 22 shown in FIG. 8A would output a signal ($V_{WIDTH}$) that corresponds to the difference between the first and last measurement times with center input signal levels, which accurately tracks the true transition region characteristic width ($w_{TR}$) for the exemplary transition record 82.

In some implementations of the post-processing circuit 22 shown in FIG. 8A, the measurement times start and end in the center region 12 of the eye diagram 10 so that the start of the transition region occurs before the end of the transition region. In these implementations, the measurement interval covers exactly one unit interval so that center input signal levels from only one transition region are measured and so that a transition region characteristic width that is expressed in a number of time slots corresponds to a known fraction of the unit interval.

Figure 9:
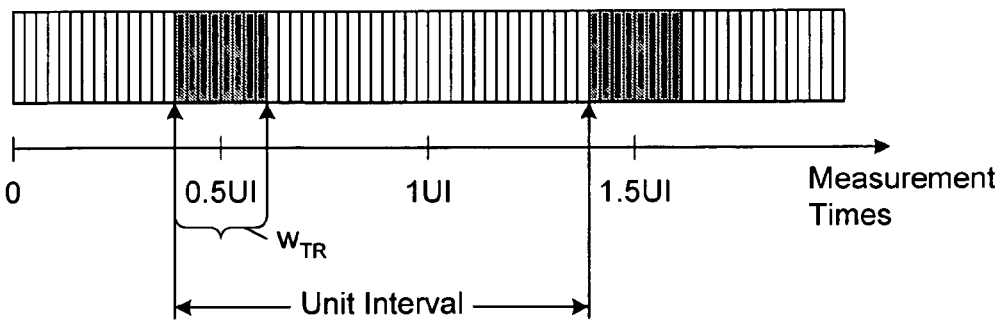
FIG. 9 is a diagrammatic view of the contents of a shift register in an implementation of the post-processing circuit of FIG. 8A.

In some other implementations of the post-processing circuit 22 shown in FIG. 8A, the measurement times start in the center region 12 of the eye diagram 10 and span between 1.5-2.0 unit intervals. In these implementations, the beginnings of two transition regions are always visible in the shift register 64, as shown in FIG. 9. These implementations include an additional register. In addition, the state machine 66 is modified to disable updates to the last register 74 at the end of the first transition region and to interpret the next true value as the start of a second transition region. The state machine 66 stores the addresses of the second transition region in the additional register. In these implementations, the timing generator 50 may or may not lock a fixed number of the measurement times into the length of one unit interval.

Figure 10:
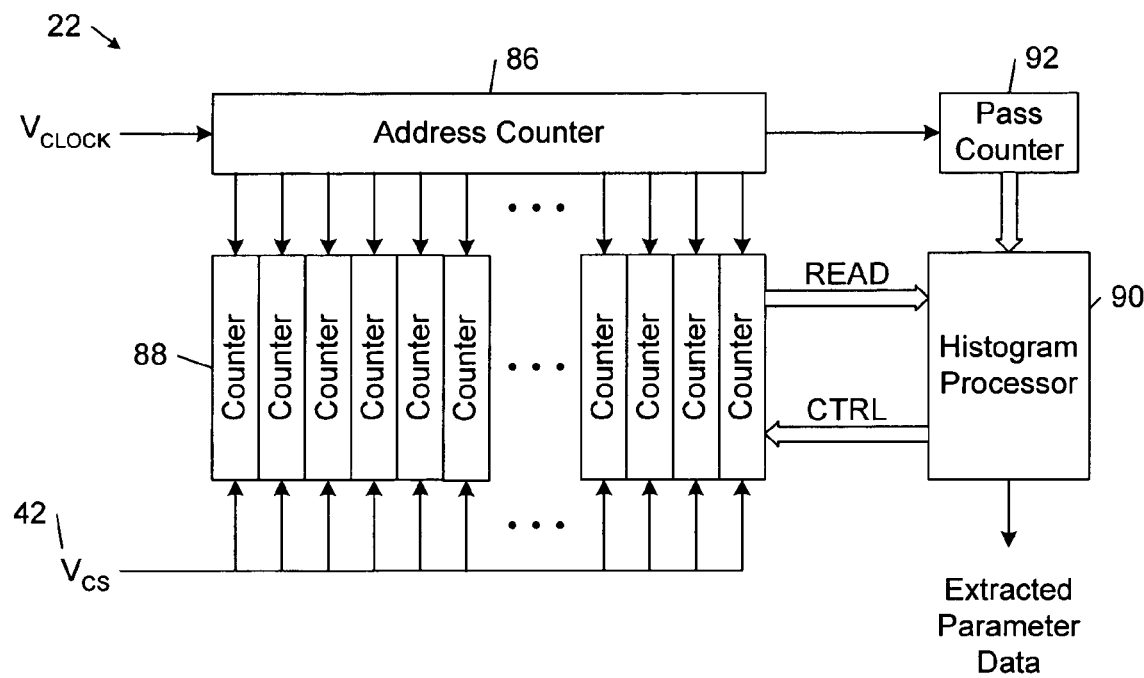
FIG. 10 is a block diagram of an implementation of the post-processing circuit shown in FIG. 2.
Figure 11:
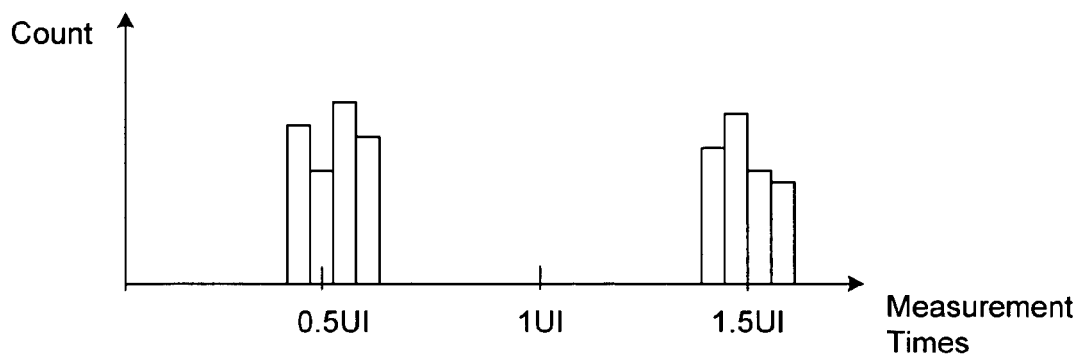
FIG. 11 is a diagrammatic view of a histogram of center input signal levels plotted as a function of measurement time.
Figure 12:
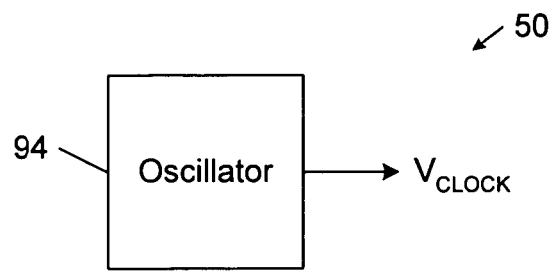
FIG. 12 is a block diagram of a timing generator for an implementation of the eye diagram characterization system shown in FIG. 2.

FIG. 10 shows another implementation of the post-processing circuit 22 that includes an address counter 86, a counter 88 for each sample time slot, a histogram processor 90, and a pass counter 92. In this implementation, the set of counters 88 stores a count per time slot, thereby creating a histogram of the density of center input signal levels. FIG. 12 shows an example of such a histogram. In operation, the address counter 86 enables one of the counters 88 at a time in sequence. Each of the enabled counters 88 is incremented if the center signal 42 is true. The pass counter 92 counts the number of complete passes over the measurement interval. The histogram processor 90 reads out all of the counters 88 after a preset number of passes have been recorded. After all of the counter data has been read out, the histogram processor 90 resets all of the counters 88.

The histogram processor 90 evaluates the counter data and can extract a measure of the width of the transition region 14, a measure of the width of the eye opening region 12, and other parameters. In this process, the histogram processor 90 may apply a threshold to distinguish time slots corresponding to measurement times with center input signal levels (full time slots) from time slots corresponding to measurement times without center input signal levels (empty time slots). In some implementations, the histogram processor 90 adjusts the threshold so that the respective numbers of full and empty time slots are greater than a preset threshold level. The histogram processor 90 may determine the transition region characteristic width from the longest contiguous span of time slots that have count numbers above the threshold. The histogram processor 90 may determine the width of the eye region 12 from the longest contiguous span of time slots that have count numbers below the threshold.

In some implementations of the post-processing circuit 22 shown in FIG. 10, the histogram processor 90 is configured to process the counter data as a ring, as opposed to an array, in which case the shape of the histogram in the ring of counters 88 is used to extract a measure of the width of the transition region 14, a measure of the width of the eye opening region 12, and other parameters. In these implementations, the position of the histogram is not used in these calculations and, therefore, the measurement clock that is generated by the timing generator 50 may or may not have a preset phase relationship with the eye diagram 10.

V. Implementations of the Timing Generator Circuit

FIG. 12 shows an implementation of the timing generator 50 that includes a free running oscillator 94. In this implementation, the measurement clock ($V_{CLOCK}$) does not have a fixed phase relationship to the main system clock that recovers the input signal 26 from the communications channel. Accordingly, this implementation of the timing generator 50 may be used in implementations of the eye diagram characterization system 18 that use the low-pass filter implementation of the post-processing circuit 22, but is not used with the other implementations of the eye diagram characterization system 18 described above.

Figure 13:
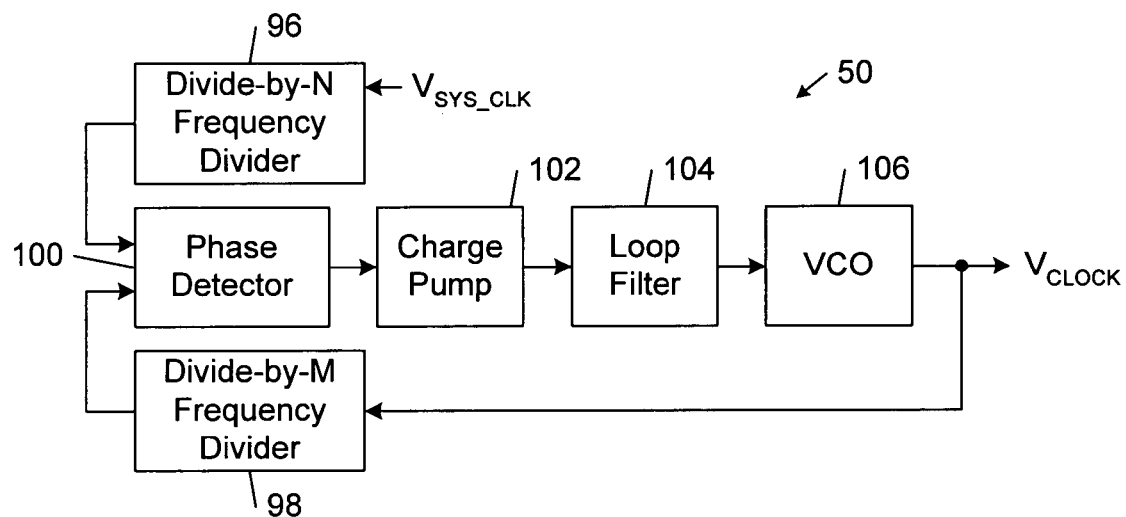
FIG. 13 is a block diagram of a timing generator for an implementation of the eye diagram characterization system shown in FIG. 2.

FIG. 13 shows a clock synthesizer implementation of the timing generator 50. The clock synthesizer includes a divide-by-N frequency divider 96, a divide-by-M frequency divider 98, a phase detector 100, a charge pump 102, a loop filter 104, and a voltage-controlled oscillator (VCO) 106. The divide-by-M frequency divider 98, the phase detector 100, the charge pump 102, the loop filter 104, and the VCO 106 form a phase-locked loop (PLL) that locks the VCO 106 to run at the frequency of the system cock ($V_{SYS\_CLK}$) multiplied by M/N. The clock synthesizer maintains a fixed phase relationship between the system clock and the measurement clock, but the relative phase depends on unknown start-up conditions. Accordingly, the clock synthesizer implementation shown in FIG. 14 may be used in implementations of the eye diagram characterization system 18 that use the low-pass filter implementation of the post-processing circuit 22. In other implementations of the eye diagram characterization system 18, the clock synthesizer includes additional start-up synchronization circuitry that synchronizes the relative phase of the measurement clock to the system clock.

Figure 14:
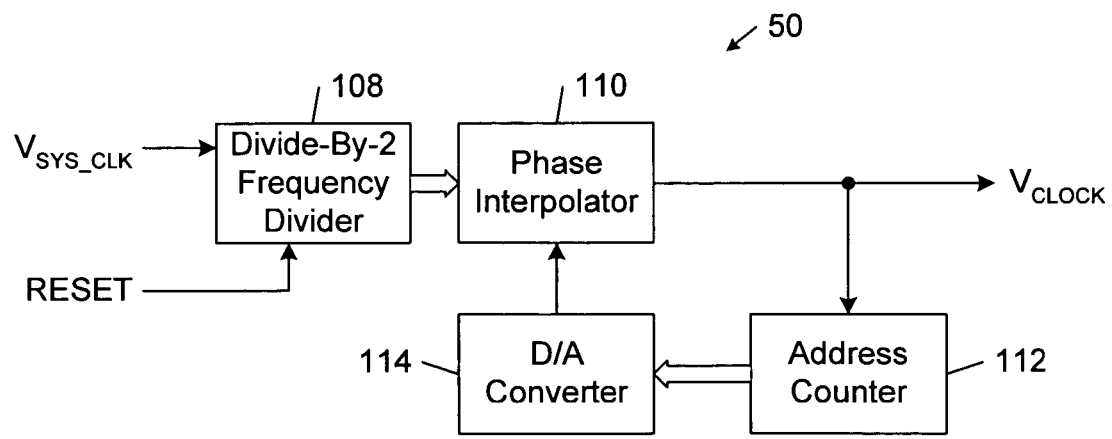
FIG. 14 is a block diagram of a timing generator for an implementation of the eye diagram characterization system shown in FIG. 2.

FIG. 14 shows an implementation of the timing generator 50 that produces repeatable measurement times with a known fixed relationship to the system clock ($V_{SYS\_CLK}$). This implementation includes a divide-by-2 frequency divider 108, a phase interpolator 110, an address counter 112, and a digital-to-analog (D/A) converter 114. The divide-by-2 frequency divider 108 is a ripple counter that is wired so as to output both in-phase and quadrature phases to the phase interpolator 110. The phase interpolator 110, under the control of the address counter 112 and the D/A converter 114, generates a measurement clock ($V_{CLOCK}$) that provides a progression of uniformly-spaced measurement times. The RESET signal resets the divide-by-2 frequency divider 108 at the start or end of each measurement to ensure a predictable fixed phase relationship between the system clock ($V_{SYS\_CLK}$) and the measurement clock ($V_{CLOCK}$). In some implementations, the address counter 112 is shared with the implementation of the post-processing circuit 22 shown in FIG. 9A.

Figure 15:
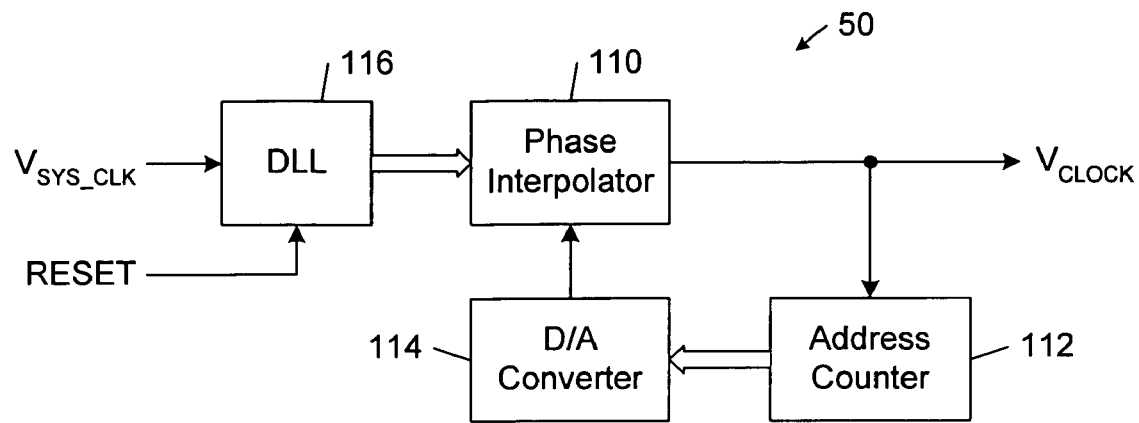
FIG. 15 is a block diagram of a timing generator for an implementation of the eye diagram characterization system shown in FIG. 2.

FIG. 15 shows another implementation of the timing generator 50 that is similar to the implementation shown in FIG. 14, except that the divide-by-2 frequency divider 108 is replaced by a delay-locked loop (DLL) 116. The DLL 116 generates multiple phases each of which has a fixed relationship to the system clock ($V_{SYS\_CLK}$). This implementation produces a measurement clock ($V_{CLOCK}$) that has the same frequency as the system clock ($V_{SYS\_CLK}$). If a slower sample rate is desired, a frequency divider can be added between the system clock input and the DLL 116. The frequency divider should be reset to ensure that the measurement clock has a predictable fixed phase relationship with respect to the system clock.

Figure 16:
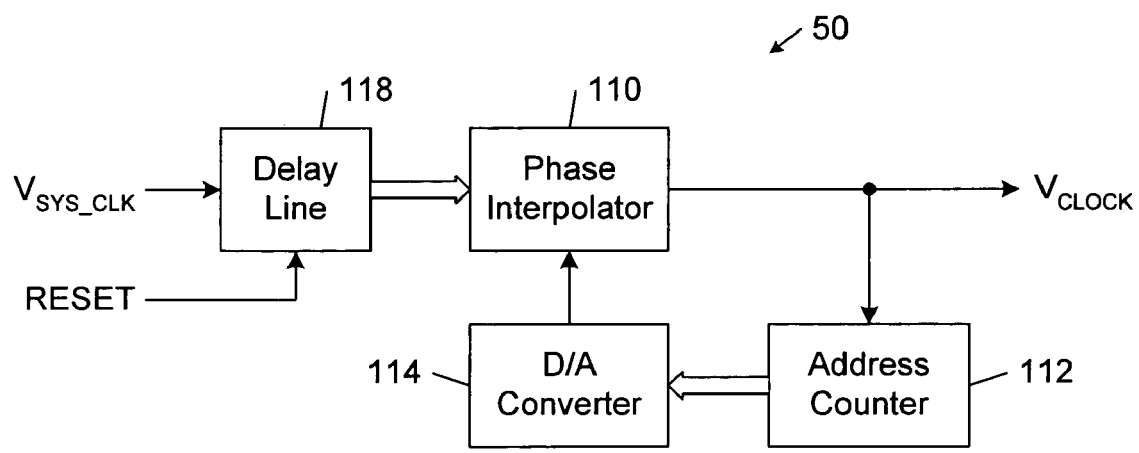
FIG. 16 is a block diagram of a timing generator for an implementation of the eye diagram characterization system shown in FIG. 2.

FIG. 16 shows another implementation of the timing generator 50 that is similar to the implementation shown in FIG. 14, except that the divide-by-2 frequency divider 108 is replaced by a delay line 118. The delay line 118 generates multiple phases each of which has a fixed relationship to the system clock ($V_{SYS_{CLK}}$). In this implementation, the phase of the measurement clock ($V_{CLOCK}$) starts on the rising edge of the system clock, but the end of the delay line (and the span of the measurement times) is not guaranteed to coincide with the end of the unit interval. This implementation of the timing generator 50 may be used with the post-processing circuit 22 described above in connection with FIG. 10.

Other embodiments are within the scope of the claims.

What is claimed is:

1. A method of characterizing an eye diagram of an input signal, comprising:
    at measurement times across a measurement interval spanning at least one unit interval of the input signal, classifying corresponding levels of the input signal into groups based on at least one threshold; wherein the unit interval is the shortest period between which the input signal can change state,
    deriving an eye diagram characteristic width based on a distribution of the levels in one of the groups across the measurement interval; and
    producing from the eye diagram characteristic width an eye diagram characteristic width signal that provides a measure of a characteristic width of the eye diagram.

2. The method of claim 1, wherein the classifying comprises classifying as center input signal levels ones of the input signal levels within a center signal band defined between a first threshold and a second threshold and classifying as non-center input signal levels ones of the input signal levels outside the center signal band.

3. The method of claim 1, wherein the deriving comprises estimating a ratio of respective populations of the input signal levels in a first one of the groups and the input signal levels in a second one of the groups.

4. The method of claim 1, wherein the deriving comprises tracking across the measurement interval earliest and latest ones of the measurement times when input signal levels within one of the groups are obtained, and equating the characteristic width to a period spanning the earliest and latest measurement times.

5. The method of claim 1, wherein the deriving comprises determining a histogram of the input signal levels in one of the groups across the measurement interval, and deriving the characteristic width from the histogram.

6. The method of claim 1, wherein the classifying is based on a first threshold and a second threshold.

7. The method of claim 2, wherein the classifying comprises generating a center signal indicative of the distributions of the center input signal levels and the non-center input signal levels across the measurement interval.

8. The method of claim 2, wherein the deriving comprises deriving a transition region characteristic width of the input signal based on a distribution of the center input signal levels across the measurement interval.

9. The method of claim 6, further comprising adjusting at least one of the first and second thresholds.

10. The method of claim 7, wherein the generating comprises outputting the center signal in a first state for each of the center input signal levels and outputting the center signal in a second state for each of the non-center input signal levels.

11. The method of claim 9, wherein the adjusting comprises narrowing separation between the first and second thresholds in response to a determination that a population of input signal levels in a group is below a threshold population level.

12. The method of claim 9, wherein the adjusting comprises widening separation between the first and second thresholds in response to a determination that the derived characteristic width is narrower than a threshold width.

13. The method of claim 10, wherein the generating comprises generating a first comparison signal based on comparisons of the input signal levels to the first threshold, generating a second comparison signal based on comparisons of the input signal levels to the second threshold, and applying a combinatorial logic operation on the first and second comparison signals to generate the center signal.

14. The method of claim 10, wherein the generating comprises generating a folded signal having a level on a first side of a decision threshold for each of the center input signal levels and having a level on a second side of the decision threshold opposite the first side for each of the non-center input signal levels, and thresholding the folded signal at the decision threshold to generate the center signal.

15. A system for characterizing an eye diagram of an input signal, comprising:
    a classification circuit operable to classify, at measurement times across a measurement interval spanning at least one unit interval of the input signal, corresponding levels of the input signal into groups based on at least one threshold; and
    a post-processing circuit coupled to the classification circuit and operable to derive an eye diagram characteristic width based on a distribution of the levels in at least one of the groups across the measurement interval wherein the unit interval is the shortest period between which the input signal can change state.

16. The system of claim 15, wherein the classification circuit is operable to classify as center input signal levels ones of the input signal levels within a center signal band defined between a first threshold and a second threshold and to classify as non-center input signal levels ones of the input signal levels outside the center signal band.

17. The system of claim 15, wherein the post-processing circuit is operable to derive the eye diagram characteristic width based on an estimation of a ratio of respective populations of the input signal levels in a first one of the groups and the input signal levels in a second one of the groups.

18. The system of claim 15, wherein the post-processing circuit is operable to track across the measurement interval earliest and latest ones of the measurement times when input signals levels within one of the groups are obtained and to equate the characteristic width to a period spanning the earliest and latest measurement times.

19. The system of claim 15, wherein the post-processing circuit is operable to determine a histogram of input signal levels within one of the groups across the measurement interval and to derive the eye diagram characteristic width from the histogram.

20. The system of claim 15, wherein the post-processing circuit is operable to derive the eye diagram characteristic width based on a first threshold and a second threshold.

21. The system of claim 16, wherein the classification circuit comprises a center signal circuit for generating a center signal indicative of the distributions of the center input signal levels and the non-center input signal levels across the measurement interval.

22. The system of claim 16, wherein the post-processing circuit is operable to derive a transition region characteristic width of the input signal based on a distribution of the center input signal levels across the measurement interval.

23. The system of claim 20, further comprising a supervisory circuit operable to adjust at least one of the high and low thresholds.

24. The system of claim 21, wherein the center signal circuit outputs the center signal in a first state for each of the center input signal levels and outputs the center signal in a second state for each of the non-center input signal levels.

25. The system of claim 23, wherein the supervisory circuit is operable to narrow separation between the first and second thresholds in response to a determination that a population of input signal levels within a group is below a threshold population level.

26. The system of claim 23, wherein the supervisory circuit is operable to widen separation between the first and second thresholds in response to a determination that the derived eye diagram characteristic width is narrower than a threshold width.

27. The system of claim 24, wherein the center signal circuit comprises a first decision circuit operable to generate a first comparison signal based on comparisons of the input signal levels to the first threshold, a second decision circuit operable to generate a second comparison signal based on comparisons of the input signal levels to the second threshold, and a combinatorial logic circuit operable to logically combine the first and second comparison signals to generate the center signal.

28. The system of claim 24, wherein the center signal circuit comprises: a folder circuit operable to generate a folded signal having a level on a first side of a decision threshold for each of the center input signal levels and having a level on a second side of the decision threshold opposite the first side for each of the non-center input signal levels; and a decision circuit operable to threshold the folded signal at the decision threshold to generate the center signal.

* * * * *

UNITED STATES PATENT AND TRADEMARK OFFICE
CERTIFICATE OF CORRECTION

PATENT NO. : 7,424,382 B2  
APPLICATION NO. : 10/996579  
DATED : September 9, 2008  
INVENTOR(S) : Steinbach et al.

Page 1 of 1

It is certified that error appears in the above-identified patent and that said Letters Patent is hereby corrected as shown below:

On the Title page, in Item (56), under "Other Publications", in column 1, line 8, delete "Nygaar," and insert -- Nygaard, --, therefor.

Signed and Sealed this

Thirty-first Day of March, 2009

JOHN DOLL  
*Acting Director of the United States Patent and Trademark Office*